US 8,604,774 B2

(12) United States Patent
Hsu (10) Patent No.: US 8,604,774 B2
(45) Date of Patent: Dec. 10, 2013

(54) CURRENT SENSING CIRCUIT WITH FEEDBACK CONTROL AND DUAL CAPACITOR SET RANGE SETTING

(75) Inventor: Chen-Ming Hsu, Tainan County (TW)

(73) Assignee: Himax Technologies Limited, Tainan (TW)

(*) Notice: Subject to any disclaimer, the term of this patent is extended or adjusted under 35 U.S.C. 154(b) by 573 days.

(21) Appl. No.: 12/961,873

(22) Filed: Dec. 7, 2010

(65) Prior Publication Data
US 2012/0139887 A1    Jun. 7, 2012

(51) Int. Cl.
*G01R 29/00* (2006.01)
(52) U.S. Cl.
USPC ........ 324/76.79; 324/658; 324/676; 324/678; 324/679; 324/686; 341/155; 341/156; 341/164; 341/165
(58) Field of Classification Search
USPC .............. 324/658, 676, 678, 679, 686, 76.79; 341/155, 156, 164, 165
See application file for complete search history.

(56) References Cited

U.S. PATENT DOCUMENTS

| 7,436,342 B2* | 10/2008 | Lauxtermann | 341/164 |
| 8,253,613 B2* | 8/2012 | Holcombe | 341/143 |
| 2008/0094272 A1* | 4/2008 | Horie | 341/158 |
| 2009/0120159 A1* | 5/2009 | Barlesi et al. | 73/1.73 |
| 2010/0102831 A1* | 4/2010 | Kuang | 324/676 |
| 2011/0272559 A1* | 11/2011 | Woolaway et al. | 250/214 R |

OTHER PUBLICATIONS

Malcovati et al. Switche capacitor dual-collectgor magnetotransistors, 1994, IEEE International Symposium on Circuits and Systems, vol. 5, 595-598.*

* cited by examiner

*Primary Examiner* — Patrick J Assouad
*Assistant Examiner* — Alexander J Nemtzow
(74) *Attorney, Agent, or Firm* — J.C. Patents (57) ABSTRACT

A current sensing circuit includes a current sensing unit, a feedback control unit and a digital output unit. The current sensing unit senses a current and produces a pulse signal according to at least one reference signal and at least one feedback signal. The current sensing unit includes a first capacitor set and a second capacitor set. The current sensing unit selects at least one capacitor in the first capacitor set and at least one capacitor in the second capacitor set according to the current value so as to adjust the precision of the current sensing circuit. The feedback control unit is coupled to the current sensing unit and produces the feedback signals according to a clock signal and the pulse signal. The digital output unit is coupled to the current sensing unit and outputs a digital signal according to the pulse signal.

14 Claims, 8 Drawing Sheets

CURRENT SENSING CIRCUIT WITH FEEDBACK CONTROL AND DUAL CAPACITOR SET RANGE SETTING

BACKGROUND OF THE INVENTION

1. Field of the Invention

The invention generally relates to a sensing circuit, and more particularly, to a current sensing circuit.

2. Description of Related Art

In order to save the consumed power of a display or provide better image quality of a display, an ambient-light sensor is broadly used in electronic apparatuses such as mobile phone, handheld apparatus and image display. Nearly all of ambient-light sensors take a photodiode architecture, which requires a voltage power for operation. A photo sensor produces different currents according to different sensed light intensities, so that a digital reading result is provided by means of a current sensing circuit inside the photo sensor.

The applicable sensing range of an ambient-light sensor is quite large, from several Lux to tens of thousands Lux. Generally, the current sensing circuit of an ambient-light sensor requires an analog-to-digital converter (ADC) with over 16-bits to meet the function need. In practical applications however, although the sensing range of an ambient-light sensor is very broad, but the precision required by the current sensing circuit is somehow different responding to the sensed light source intensity. For example, when a light source is darker (below 1000 Lux), the precision required by an ambient-light sensor is about 1 Lux and the corresponding precision of the current sensing circuit is relatively high; when a light source is lighter (over 10000 Lux), the precision required by an ambient-light sensor is about 20-30 Lux and the corresponding precision of the current sensing circuit is relatively lower.

Hence, it is necessary for the related manufactures to provide a current sensing circuit with different precisions responding to different current sensing ranges.

SUMMARY OF THE INVENTION

Accordingly, the invention is directed to a current sensing circuit with different precisions responding to different current sensing ranges.

The invention provides a current sensing circuit, which includes a current sensing unit, a feedback control unit and a digital output unit. The current sensing unit senses a current and produces a pulse signal according to at least one reference signal and at least one feedback signal. The current sensing unit includes a first capacitor set and a second capacitor set. The current sensing unit selects at least one capacitor in the first capacitor set and at least one capacitor in the second capacitor set according to the current value so as to adjust the precision of the current sensing circuit. The feedback control unit is coupled to the current sensing unit and produces the at least one feedback signal according to a clock signal and the pulse signal. The digital output unit is coupled to the current sensing unit and outputs a digital signal according to the pulse signal.

In an embodiment of the invention, the above-mentioned current sensing unit includes a sensing unit and a comparison unit. The sensing unit senses the current and produces a sensing voltage according to a first reference signal and the at least one feedback signal. The sensing unit includes the first capacitor set and the second capacitor set. The comparison unit is coupled to the sensing unit, compares the sensing voltage with a level of a second reference signal and outputs the pulse signal.

In an embodiment of the invention, the above-mentioned sensing unit further includes an operation amplifier. The operation amplifier includes a first terminal, a second terminal and an output terminal. The current is output from the first terminal of the operation amplifier according to a first feedback signal, the second terminal of the operation amplifier is coupled to the first reference signal and the output terminal of the operation amplifier outputs the sensing voltage.

In an embodiment of the invention, the above-mentioned first capacitor set includes a first terminal and a second terminal. The first terminal of the first capacitor set is coupled to the output terminal of the operation amplifier, and the second terminal of the first capacitor set is coupled to the first terminal of the operation amplifier.

In an embodiment of the invention, the above-mentioned first capacitor set includes a plurality of capacitors, and the capacitors of the first capacitor set are coupled in parallel between the first terminal and the second terminal of the first capacitor set.

In an embodiment of the invention, the above-mentioned second capacitor set includes a first terminal and a second terminal. The first terminal of the second capacitor set is coupled to the first reference signal or a first voltage according to a second feedback signal and a third feedback signal. The second terminal of the second capacitor set is coupled to the first terminal of the operation amplifier or a second voltage according to the second feedback signal and the third feedback signal.

In an embodiment of the invention, the above-mentioned second capacitor set includes a plurality of capacitors, and the capacitors of the second capacitor set are coupled in parallel between the first terminal and the second terminal of the second capacitor set.

In an embodiment of the invention, the above-mentioned current sensing unit selects a first capacitor in the first capacitor set and a second capacitor in the second capacitor set. One terminal of the first capacitor is coupled to the output terminal of the operation amplifier. The other terminal of the first capacitor is coupled to the first terminal of the operation amplifier. One terminal of the second capacitor is coupled to the first reference signal or a first voltage according to a second feedback signal and a third feedback signal. The other terminal of the second capacitor is coupled to the first terminal of the operation amplifier or a second voltage according to the second feedback signal and the third feedback signal.

In an embodiment of the invention, the above-mentioned comparison unit includes a comparator. The comparator includes a first terminal, a second terminal and an output terminal. The first terminal of the comparator is coupled to a second reference signal, and the second terminal of the comparator is coupled to the output terminal of the operation amplifier to receive the sensing voltage. The comparator compares the sensing voltage with the second reference signal so as to output the pulse signal at the output terminal of the comparator.

In an embodiment of the invention, the above-mentioned feedback control unit includes a first inverter, an AND gate and a second inverter. The first inverter is coupled to the current sensing unit and inverts the pulse signal so as to produce a first feedback signal. The AND gate includes a first terminal, a second terminal and an output terminal. The first terminal of the AND gate is coupled to the current sensing unit to receive the pulse signal, and the second terminal of the AND gate receives the clock signal. The AND gate outputs a second feedback signal at the output terminal of the AND gate according to the pulse signal and the clock signal. The second inverter is coupled to the AND gate and inverts the second feedback signal so as to produce a third feedback signal.

In an embodiment of the invention, the above-mentioned digital output unit includes an N-bit counter. The N-bit counter is coupled to the current sensing unit. The N-bit counter counts a pulse quantity of the pulse signal in a predetermined time duration so as to output the digital signal, wherein the pulse quantity is positively correlated to the current value.

In an embodiment of the invention, the above-mentioned current sensing circuit further includes a controller. The controller is coupled to the digital output unit and selects the at least one capacitor in the first capacitor set and the at least one capacitor in the second capacitor set according to the digital signal so as to adjust the precision of the current sensing circuit.

In an embodiment of the invention, the above-mentioned controller adjusts the second voltage value according to the digital signal so as to adjust the precision of the current sensing circuit.

In an embodiment of the invention, the above-mentioned current sensing circuit further includes a photodiode. The photodiode is coupled to the current sensing unit and senses a light source so as to produce the current.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the preferred embodiments of the invention, examples of which are illustrated in the accompanying drawings. Wherever possible, the same reference numbers are used in the drawings and the description to refer to the same or like parts.

In the exemplary embodiments of the invention, the current sensing circuit is suitable for an ambient-light sensor, and the current sensing circuit can, but not limited to, provide different precisions according to different current sensing ranges. In addition, the current sensing circuit can provide a photodiode with a voltage power and directly output the sensed current value in digital format without employing a conventional voltage ADC. Therefore, an electronic apparatus using the ambient-light sensor can read the digital value thereof to master the situation of ambient-light and moreover to control the system thereof so as to achieve green display with low consumption and high efficiency.

Figure 1:
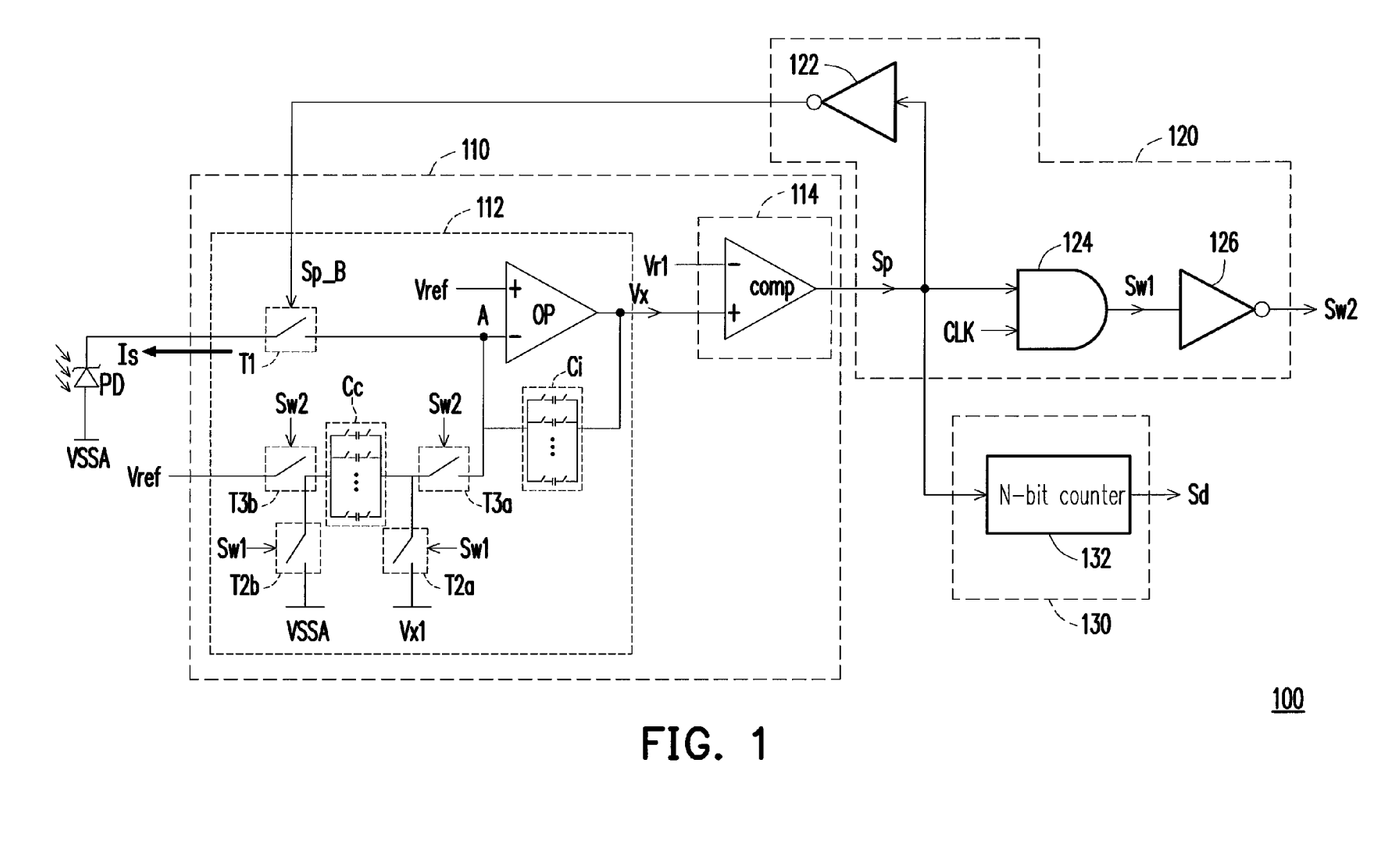
FIG. 1 is a diagram of a current sensing circuit according to an embodiment of the invention.
Figure 2:
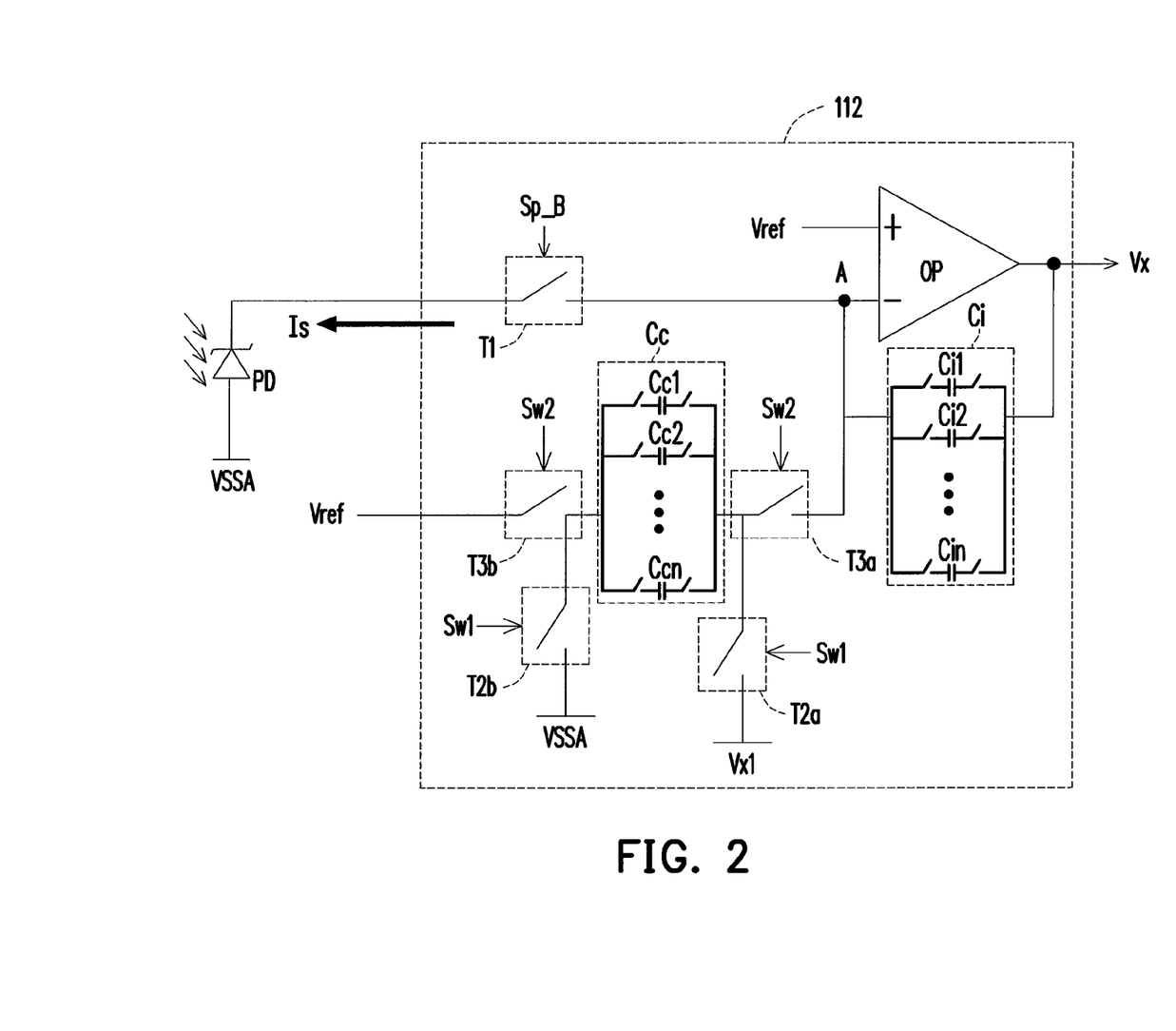
FIG. 2 is a partial diagram of a current sensing circuit according to an embodiment of the invention.

FIG. 1 is a diagram of a current sensing circuit according to an embodiment of the invention. FIG. 2 is a partial diagram of a current sensing circuit according to an embodiment of the invention. Referring to FIGS. 1 and 2, in the embodiment, a current sensing circuit 100 includes a current sensing unit 110, a feedback control unit 120, a digital output unit 130 and a photodiode PD.

The current sensing unit 110 senses a current Is produced by the photodiode PD responding to an ambient-light condition and produces a pulse signal Sp according to reference signals Vref and Vr1 and feedback signals Sp_B, Sw1 and Sw2. In the embodiment, the current sensing unit 110 includes a first capacitor set Ci and a second capacitor set Cc. The first capacitor set Ci therein includes a plurality of capacitors coupled in parallel Ci1, Ci2, . . . , Cin and the second capacitor set Cc includes a plurality of capacitors coupled in parallel Cc1, Cc2, . . . , Ccn, as shown in FIG. 2. The current sensing unit 110 selects at least one capacitor in the first capacitor set Ci and at least one capacitor in the second capacitor set Cc according to the amount of the current Is so as to adjust the precision of the current sensing circuit. In other words, in the embodiment, the current sensing circuit 100 can provide different precisions responding to different current sensing ranges.

The feedback control unit 120 is coupled to the current sensing unit 110 and produces feedback signals Sp_B, Sw1 and SW2 according to a clock signal CLK and the pulse signal Sp. The digital output unit 130 is coupled to the current sensing unit 110 and outputs a digital signal Sd according to the pulse signal Sp. In other words, in the embodiment, the current sensing circuit 100 can directly convert the current Is into the digital signal Sd without using a conventional voltage ADC.

In more details, the current sensing unit 110 includes a sensing unit 112 and a comparison unit 114. The sensing unit 112 senses the current Is and produces a sensing voltage Vx according to the first reference signal Vref and the feedback signals Sp_B, Sw1 and Sw2. The comparing unit 114 is coupled to the sensing unit 112 and compares the sensing voltage Vx with the level of the second reference signal Vr1 so as to output the pulse signal Sp.

In the embodiment, the sensing unit 112 includes an operation amplifier OP, the first capacitor set Ci and the second capacitor set Cc. The current Is flows from the node A to the photodiode PD according to the first feedback signal Sp_B, wherein the node A is coupled to an inverting terminal (i.e., the first terminal) of the operation amplifier OP. A non-inverting terminal (i.e., the second terminal) of the operation amplifier OP is coupled to the first reference signal Vref. An output terminal of the operation amplifier OP outputs the sensing voltage Vx. Therein, a switch T1 is disposed on the path through which the current Is passes, and the on/off status of the switch T1 is controlled by the first feedback signal Sp_B. The cathode of the photodiode PD is coupled to the node A and the anode of the photodiode PD is coupled to a first voltage VSSA. When the switch T1 is turned on, according to the virtual-short-circuit principle of an operation amplifier, the voltage at the node A is equal to the first reference signal Vref. Hence, the first reference signal Vref serves as the voltage power of the photodiode PD.

The first capacitor set Ci includes a first terminal and a second terminal. The first terminal of the first capacitor set Ci is coupled to the output terminal of the operation amplifier OP, and the second terminal of the first capacitor set Ci is coupled to the inverting terminal (i.e., the node A) of the operation amplifier OP. The second capacitor set Cc includes a first terminal and a second terminal. The first terminal of the second capacitor set Cc is coupled to the first reference signal Vref or the first voltage VSSA according to the second feedback signal Sw1 and the third feedback signal Sw2. The second terminal of the second capacitor set Cc is coupled to the inverting terminal of the operation amplifier OP or a second voltage Vx1 according to the second feedback signal Sw1 and the third feedback signal Sw2. Therein, the circuit configuration of the second capacitor set Cc, the switches T2a, T2b, T3a and T3b and the corresponding feedback signals Sw1 and Sw2 is a standard switching capacitor, which forms an equivalent positive resistance. As a result, the sensing unit 112 functions as an integrator.

In the embodiment, the comparison unit 114 includes a comparator comp. The inverting terminal (i.e., the first terminal) of the comparator comp is coupled to the second reference signal Vr1. The non-inverting terminal (i.e., the second terminal) of the comparator comp is coupled to the output terminal of the operation amplifier OP for receiving the sensing voltage Vx. The comparator comp compares the sensing voltage Vx with the second reference signal Vr1 so as to output the pulse signal Sp at the output terminal thereof.

In the embodiment of the invention, the feedback control unit 120 includes a first inverter 122, an AND gate 124 and a second inverter 126. The first inverter 122 is coupled to the current sensing unit 110 and inverts the pulse signal Sp so as to produce a first feedback signal Sp_B. An input terminal (i.e., the first terminal) of the AND gate 124 is coupled to the current sensing unit 110 to receive the pulse signal Sp, and the other input terminal (i.e., the second terminal) of the AND gate 124 receives the clock signal CLK. The AND gate 124 outputs the second feedback signal Sw1 at the output terminal thereof according to the pulse signal Sp and the clock signal CLK. The second inverter 126 is coupled to the AND gate 124 and inverts the second feedback signal Sw1 so as to produce a third feedback signal Sw2.

In the embodiment of the invention, the digital output unit 130 includes an N-bit counter 132. The N-bit counter 132 is coupled to the current sensing unit 110. The N-bit counter counts a pulse quantity of the pulse signal Sp in a predetermined time duration so as to output the digital signal Sd, wherein the pulse quantity of the pulse signal Sp is positively correlated to the current value Is. In other words, the more the pulse quantity of the pulse signal Sp counted by the N-bit counter in the predetermined time duration, the larger the current Is sensed by the current sensing unit 110 is.

Figure 3:
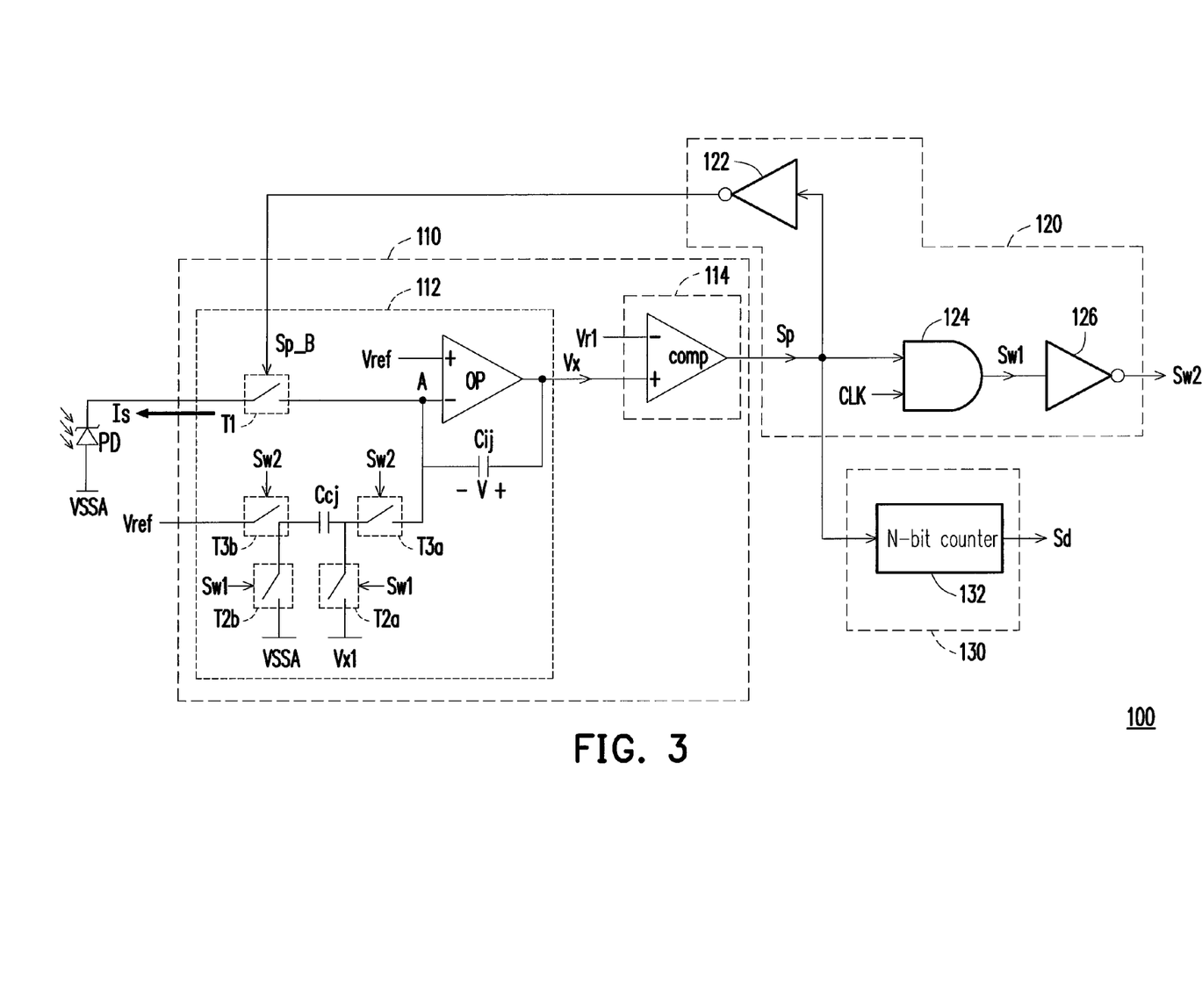
FIG. 3 is the diagram of the current sensing circuit of FIG. 1.
Figure 4:
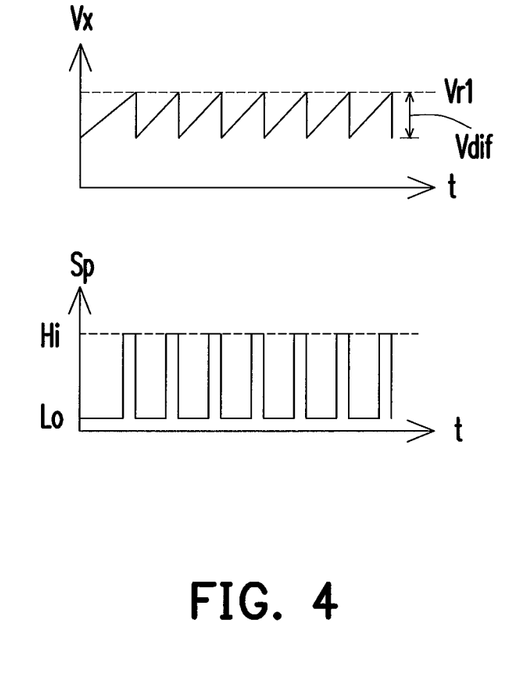
FIG. 4 is a signal waveform diagram respectively showing a sensing voltage and a pulse signal.

In more details, FIG. 3 is the diagram of the current sensing circuit of FIG. 1 and FIG. 4 is a signal waveform diagram respectively showing a sensing voltage and a pulse signal. Referring to FIGS. 3 and 4, in the embodiment, the current sensing unit 110, according to the amount of the current Is, for example, selects the capacitor Cij (i.e., the first capacitor) in the first capacitor set Ci and the capacitor Ccj (i.e., the second capacitor) in the second capacitor set Cc to adjust the precision of the current sensing circuit 100. Therein, a terminal of the capacitor Cij is coupled to the output terminal of the operation amplifier OP and the other terminal of the capacitor Cij is coupled to the inverting terminal of the operation amplifier OP. A terminal of the capacitor Ccj is coupled to the first reference signal Vref or the first voltage VSSA according to the feedback signals Sw1 and Sw2 and the other terminal of the capacitor Ccj is coupled to the inverting terminal of the operation amplifier OP or the second voltage Vx1 according to the feedback signals Sw1 and Sw2.

According to the virtual-short-circuit principle of an operation amplifier, the voltage at the node A is equal to the first reference signal Vref. When the switch T1 is turned on, the first reference signal Vref can serve as the voltage power of the photodiode PD, which further makes the photodiode PD able to sense an ambient light source to produce the current Is, wherein the amount of the current Is is proportional to the light power intensity; i.e., the stronger the light power intensity, the larger the current Is is.

In the embodiment, the current Is is provided by the sensing voltage Vx output from the operation amplifier OP. According to the charge principle, the current $Is=dQ/dt$ and there is a voltage difference V between the both terminals of the capacitor Cij, and $V=Q \times Cij$, wherein Q represents charge and t represents time. The ascending slope $dVx/dt$ of the sensing voltage Vx can be induced from the above-mentioned formulae, $dVx/dt=Is/Ci$. When the sensing voltage Vx is greater than the second reference signal Vr1, the comparator comp outputs the pulse signal Sp with high-level Hi. As a result, the N-bit counter 132 would be increased by one.

On the other hand, the pulse signal Sp output from the comparator comp is high-level Hi, so that the first feedback signal Sp_B would turn off the switch T1 and cut off the voltage power supplied to the photodiode PD, i.e., disconnect the first reference signal Vref from the photodiode PD. Meanwhile, the charging/discharging mechanism of the capacitor Ccj is activated and the capacitor Cij enters a charging status. In other words, when both the clock signal CLK and the pulse signal Sp are high-levels, the feedback signals Sw1 and Sw2 are respectively high-level and low-level, which further turns on the switches T2a and T2b and turns off the switches T3a and T3b. At the time, the capacitor Ccj is charged, wherein the charging voltage is the second voltage Vx1.

Moreover, at first, the switches T2a and T2b are driven since the clock signal CLK takes high-level Hi. At the time, the switches T2a and T2b are turned on and the second voltage Vx1 is saved in the capacitor Ccj. Next, when the switches T3a and T3b are turned on, the switches T2a and T2b are turned off and the charges stored in the capacitor Ccj are released, which causes the sensing voltage Vx fall down and the voltage difference between that prior to the falling and that after the falling is $Vdif=Vx1 \times Ccj/Cij$. After that, after the sensing voltage Vx falls down, the comparator comp resumes to output the pulse signal Sp with low-level Lo and the first reference signal Vref resumes to be supplied to the photodiode PD as the voltage power thereof. Hence, the current Is continuously rises up the sensing voltage Vx until the sensing voltage Vx is greater than the second reference signal Vr1 again so as to activate the charging/discharging mechanism of the capacitor Ccj once more. At the time, the N-bit counter 132 would be increased by one again.

After a predetermined duration of the operation, the N-bit counter 132 outputs the counted value thereby, wherein the value represents the amount of the current Is. Since the ascending slope $dVx/dt$ of the sensing voltage Vx is Is/Ci, when the voltage difference value Vdif is fixed, a larger ascending slope $dVx/dt$ represents a more starting number of the comparator comp, and the digital output of the N-bit counter 132 is consequently larger, wherein the digital output represents the amount of the current Is.

Figure 5:
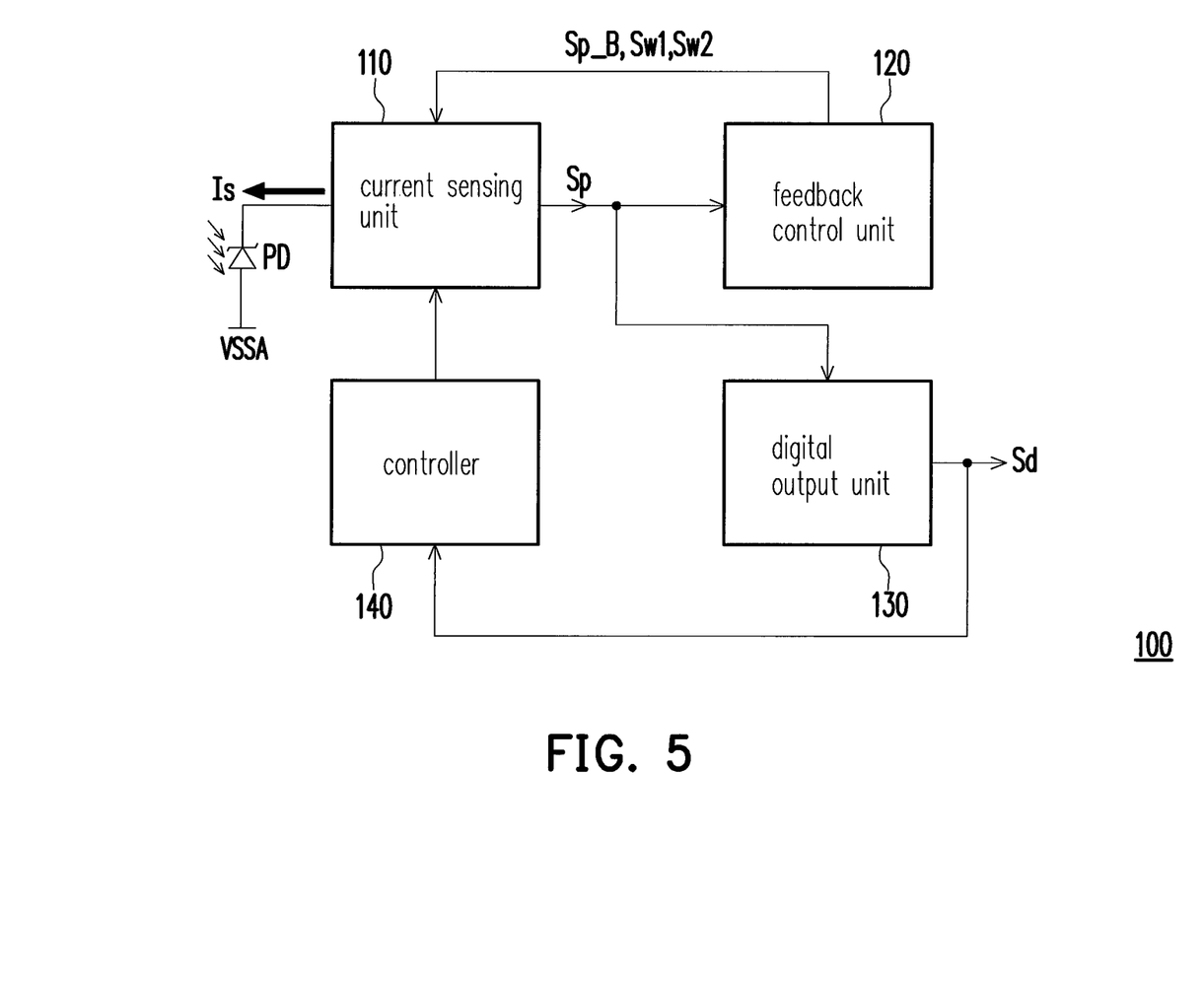
FIG. 5 is a block diagram of the current sensing circuit of FIG. 1.

FIG. 5 is a block diagram of the current sensing circuit of FIG. 1. Referring to FIG. 5, in the embodiment, the current sensing circuit 100 further includes a controller 140. The controller 140 is coupled to the digital output unit 130, selects at least one capacitor (the first capacitor) in the first capacitor set Ci and at least one capacitor (the second capacitor) in the second capacitor set Cc according to the digital signal Sd and adjusts the amount of the sensing voltage Vx so as to adjust the precision of the current sensing circuit 100.

Generally, if the first capacitor, the second capacitor and the second voltage of the current sensing circuit are unable to be adjusted and the circuit architecture of FIG. 1 is used to reach a high resolution, the time for converting analog signal into digital signal (ADC time) would be quite long. For example, if a digital signal with a 10-bits resolution is needed, at least 1024 CLKs of the clock signal of the current sensing circuit are required. Therefore, for the applications with the varied current speed, the current sensing circuit is limited in applications.

On the other hand, if the converting time is fixed, i.e., the resolution is fixed, the maximum detectable current of the current sensing circuit can be determined by the first capacitor, the second capacitor and the second voltage. That is to say, under the circuit architecture of FIG. 1, the maximum detectable current Is of the current sensing circuit 100 is proportional to the first capacitor Cij, the second capacitor Ccj and the second voltage Vx1.

Figure 6:
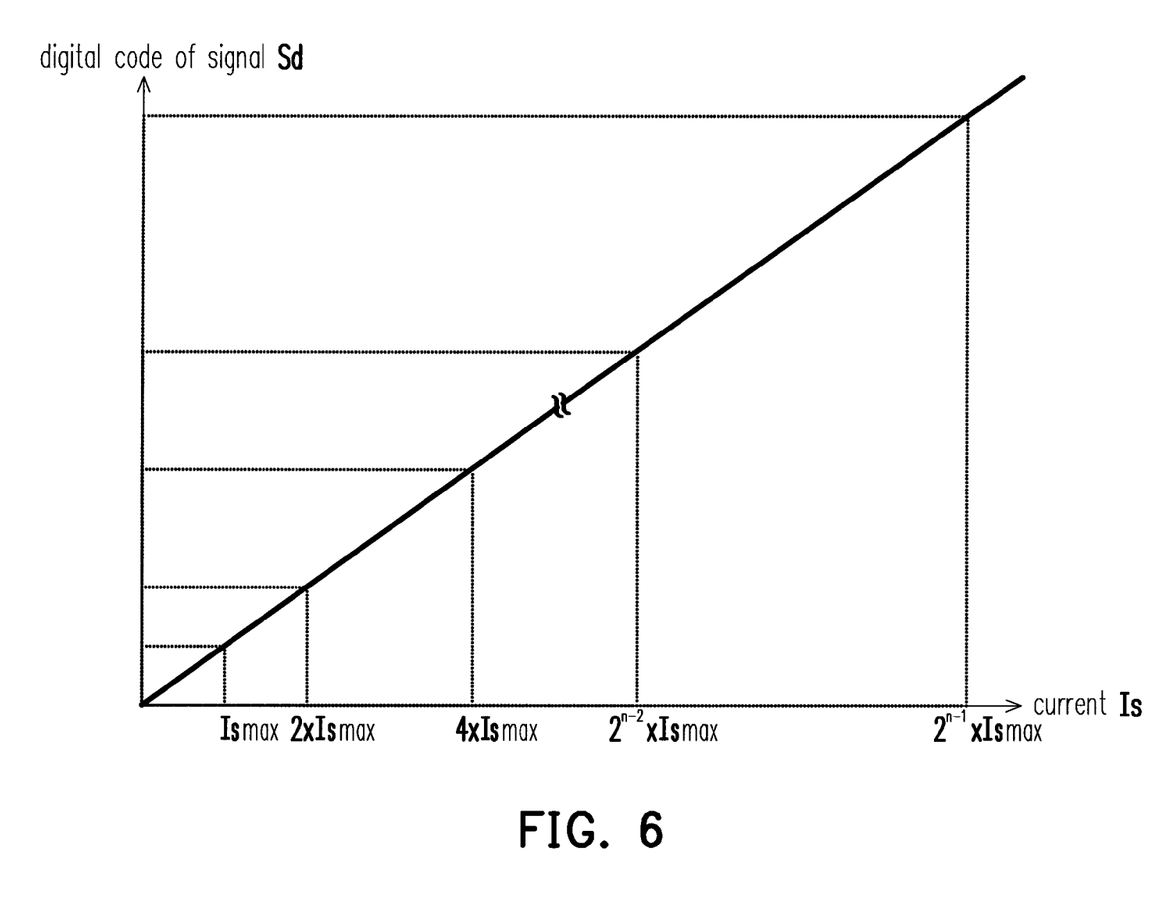
FIG. 6 is a diagram showing a current sensing circuit divides a range to be measured into blocks.

Therefore, in order to advance the speed for converting analog signal into digital signal (ADC speed) and reach a broader sensing range, the current sensing circuit of the embodiment would select different first capacitors Cij, different second capacitors Ccj and different second voltages Vx1 responding to different current so as to divide the range to be measured into blocks for sensing, as shown by FIG. 6. FIG. 6 is a diagram showing a current sensing circuit divides a range to be measured into blocks. In FIG. 6, the current sensing circuit 100 divides the range to be measured into $2^n$ sub-ranges, i.e., 0-Ismax, 0-2×Ismax, 0-4×Ismax, 0-$2^{n-2}$×Ismax and 0-$2^{n-1}$×Ismax, wherein the maximum sensed value of each range is increased for two times in comparison with the last one; i.e., 2×Ismax is double of Ismax, 4×Ismax is double of 2×Ismax, ..., $2^{n-1}$×Ismax is double of $2^{n-2}$×Ismax. In the embodiment, the resolution of each sensing range is N-bit, so that the overall sensing range of the current sensing circuit can reach (n+N)-bits.

On the other hand, since the resolution of each sensing range is N-bit, hence, the larger the sensing range, the lower the precision is. For example, for the sensing range of 0-Ismax, the precision is Ismax/$2^N$; for the sensing range of 0-2×Ismax, the precision is Ismax/$2^{N-1}$; for the sensing range of 0-4×Ismax, the precision is Ismax/$2^{N-2}$; for the sensing range of 0-$2^{n-2}$×Ismax, the precision is Ismax/$2^{N-n+2}$; for the sensing range of 0-$2^{n-1}$×Ismax, the precision is Ismax/$2^{N-n+1}$. In other words, the larger the sensing range of the current sensing circuit, the lower the precision is. On the contrary, the precision within the minimum range is the highest. It can be seen that the precision of the current sensing circuit is inversely proportional to the amount of the sensing range. To obtain the optimum precision, the minimum sensing range needs to be selected during measuring, and the value to be measured must be less than the maximum value of the sensing range.

In following exemplary embodiments, an operation method of a current sensing circuit is shown, wherein appropriate sensing ranges can be quickly selected so as to obtain better precisions.

Figure 7:
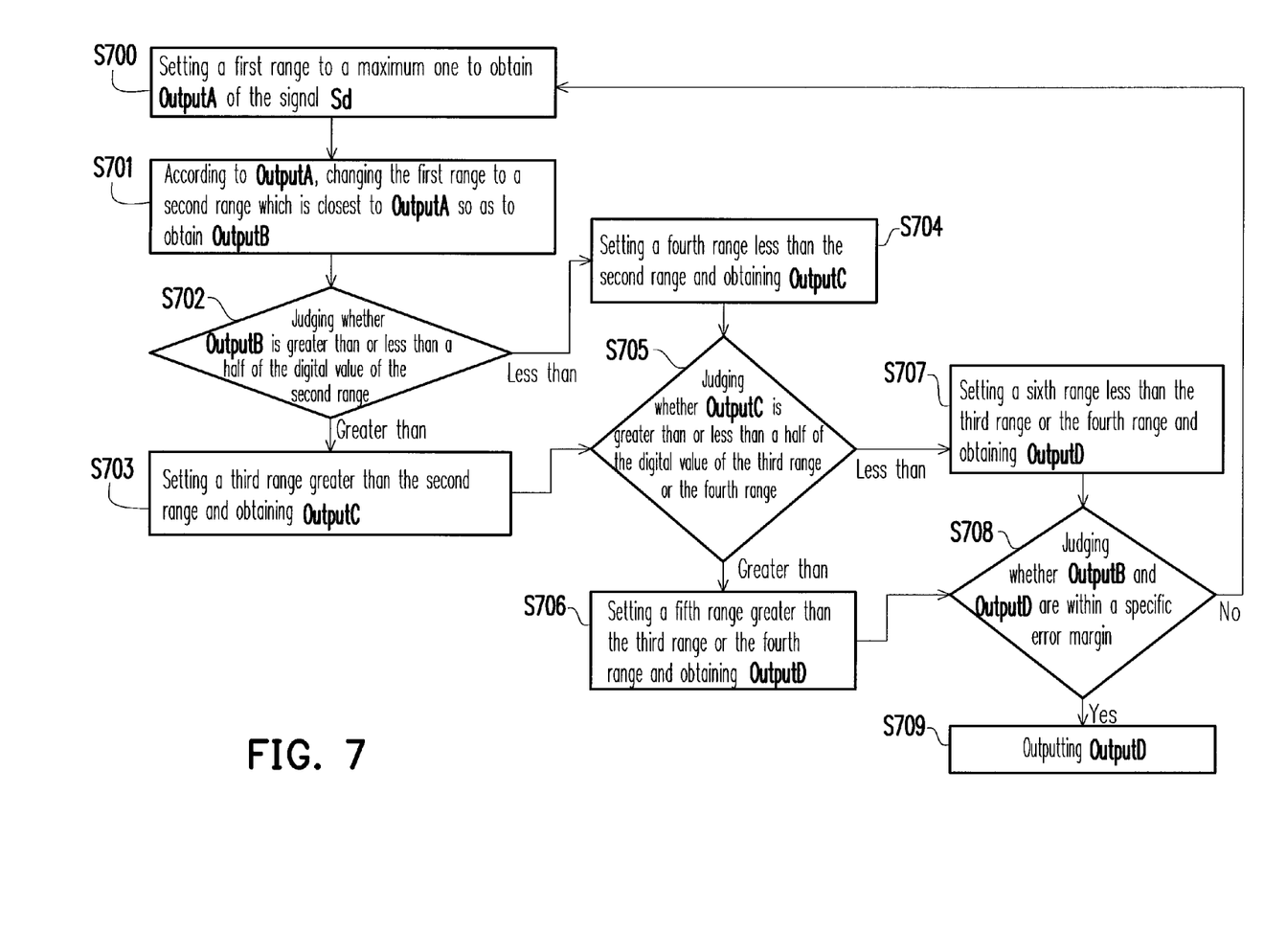
FIG. 7 is a circuit operation method flowchart according to an embodiment of the invention.
Figure 8:
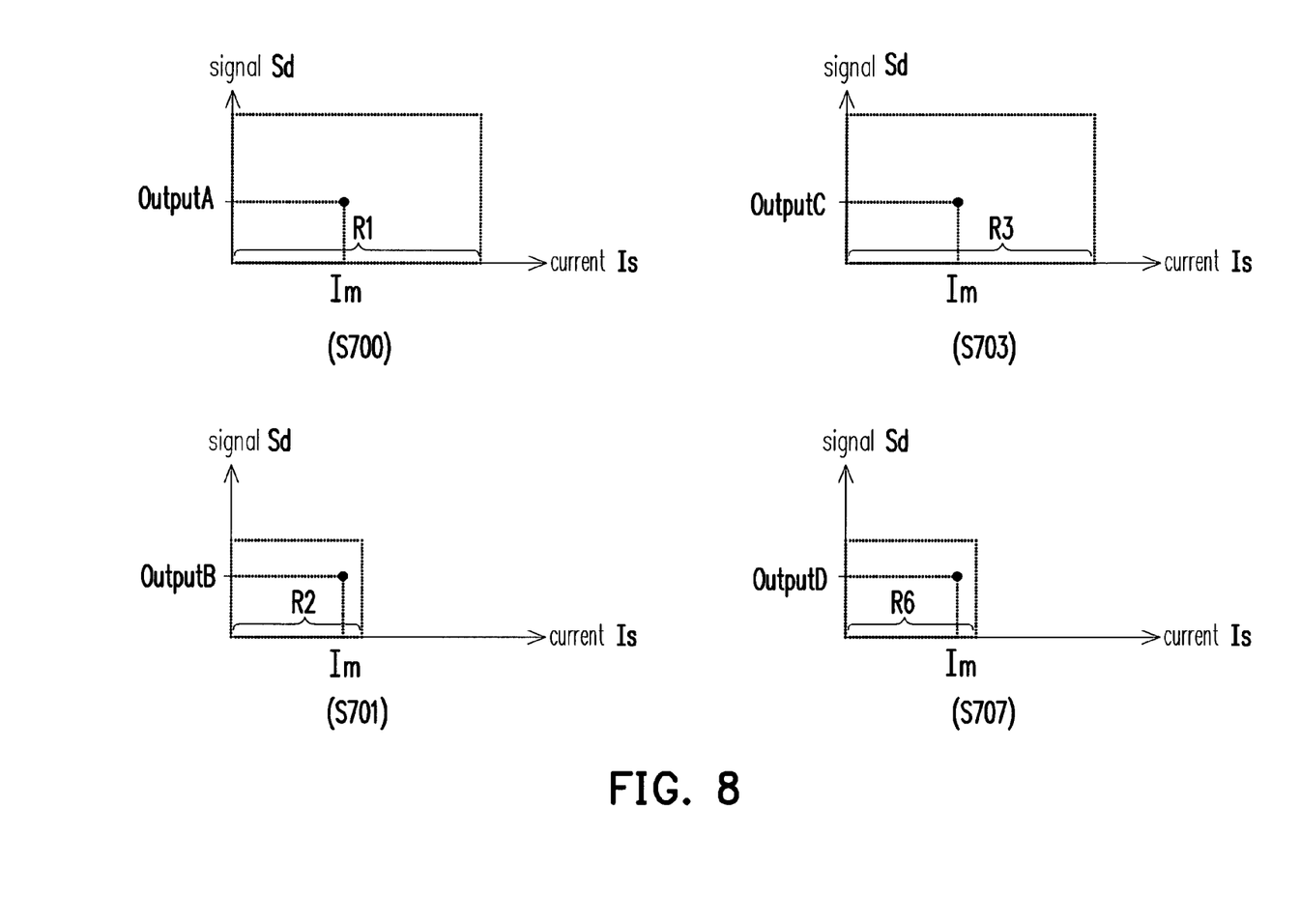
FIG. 8 is a diagram showing the relationships between the current to be measured and the digital output thereof of the current sensing circuit according to the circuit operation method of FIG. 7.

FIG. 7 is a circuit operation method flowchart according to an embodiment of the invention and FIG. 8 is a diagram showing the relationships between the current to be measured Im and the digital output thereof of the current sensing circuit according to the circuit operation method of FIG. 7. Referring to FIGS. 5, 7 and 8, in the embodiment, in step S700, a first sensing range R1 is set to a maximum one for the current sensing circuit 100 at the beginning so as to sense the current to be measured Im and further to obtain the digital output OutputA of the signal Sd. Next, according to the digital output OutputA, the first sensing range R1 is changed to a second range R2 which is closest to the digital output OutputA so as to obtain the digital output OutputB, as shown in step S701.

After that in step S702, it is judged whether or not the digital output OutputB is greater than or less than a half of the digital value of the second range R2. If the digital output OutputB is greater than the half of the digital value, the current sensing circuit 100 would be set to a third range R3 greater than the second range R2 and a corresponding digital output OutputC is obtained, as shown in step S703. Otherwise, if the digital output OutputB is less than the half of the digital value, the current sensing circuit 100 would be set to a fourth range R4 (not shown) less than the second range R2, as shown in step S704. In this way, the current sensing circuit 100 can obtain a digital output OutputC. FIG. 8 shows the case where the digital output OutputB is greater than the half of the digital value of the second range R2.

Further in step S705, it is judged whether or not the digital output OutputC is greater than or less than a half of the digital value of the third range R3 or the fourth range R4. If the digital output OutputC is greater than the half of the digital value, the current sensing circuit 100 would be set to a fifth range R5 (not shown) greater than the third range R3 or the fourth range R4, as shown in step S706. Otherwise, if the digital output OutputC is less than the half of the digital value, the current sensing circuit 100 would be set to a sixth range R6 less than the third range R3 or the fourth range R4, and a corresponding digital output OutputD is obtained, as shown in step S707. In this way, the current sensing circuit 100 can obtain a digital output OutputD. FIG. 8 shows the case where the digital output OutputC is less than the half of the digital value of the third range R3.

Finally in step S708, it is judged whether or not the digital outputs OutputB and OutputD are within a certain error margin. If they are within the error margin, the digital output OutputD is output as step S709; otherwise, the flow goes back to step S700.

According to the above-mentioned method, the current sensing circuit 100 can obtain the digital output of the signal Sd, in the quickest way, after converting data for four times. Assuming the measurement is conducted without dividing the current sensing range into sub-ranges and selecting appropriate sub-ranges, at least 65535 CLKs are needed for a current sensing circuit with 16-bits resolution to obtain the digital output the same as the embodiment. On the contrary, for the current sensing circuit 100 with 10-bits resolution of the embodiment where the current sensing range is divided into 64 sub-ranges, the current sensing circuit 100 can finish the converting data job in a period of 1024×4=4096 CLKs, which largely reduces the converting time so that the current sensing circuit can be used in current conversion with quicker frequency variation.

In summary, in the exemplary embodiments of the invention, the current sensing circuit can provide different precisions responding to different current sensing ranges, which further controls the system thereof to achieve green display with low consumption and high efficiency.

It will be apparent to those skilled in the art that the descriptions above are several preferred embodiments of the invention only, which does not limit the implementing range of the invention. Various modifications and variations can be made to the structure of the invention without departing from the scope or spirit of the invention.

What is claimed is:

1. A current sensing circuit, comprising:
   a current sensing unit sensing a current and producing a pulse signal according to at least one reference signal and at least one feedback signal, wherein the current sensing unit comprises a first capacitor set and a second capacitor set, the current sensing unit selects at least one capacitor in the first capacitor set and at least one capacitor in the second capacitor set according to the current value so as to adjust the precision of the current sensing circuit;
   a feedback control unit coupled to the current sensing unit and producing the at least one feedback signal according to a clock signal and the pulse signal; and
   a digital output unit coupled to the current sensing unit and outputting a digital signal according to the pulse signal.

2. The current sensing circuit as claimed in claim 1, wherein the current sensing unit comprises:
   a sensing unit sensing the current and producing a sensing voltage according to a first reference signal and the at least one feedback signal, wherein the sensing unit comprises the first capacitor set and the second capacitor set; and
   a comparison unit coupled to the sensing unit, comparing the sensing voltage with a level of a second reference signal and outputting the pulse signal.

3. The current sensing circuit as claimed in claim 2, wherein the sensing unit further comprises:
   an operation amplifier comprising a first terminal, a second terminal and an output terminal, wherein the current is output from the first terminal of the operation amplifier according to a first feedback signal, the second terminal of the operation amplifier is coupled to the first reference signal and the output terminal of the operation amplifier outputs the sensing voltage.

4. The current sensing circuit as claimed in claim 3, wherein the first capacitor set comprises a first terminal and a second terminal, the first terminal of the first capacitor set is coupled to the output terminal of the operation amplifier and the second terminal of the first capacitor set is coupled to the first terminal of the operation amplifier.

5. The current sensing circuit as claimed in claim 4, wherein the first capacitor set comprises a plurality of capacitors, and the capacitors of the first capacitor set are coupled in parallel between the first terminal and the second terminal of the first capacitor set.

6. The current sensing circuit as claimed in claim 4, wherein the second capacitor set comprises a first terminal and a second terminal, the first terminal of the second capacitor set is coupled to the first reference signal or a first voltage according to a second feedback signal and a third feedback signal, and the second terminal of the second capacitor set is coupled to the first terminal of the operation amplifier or a second voltage according to the second feedback signal and the third feedback signal.

7. The current sensing circuit as claimed in claim 6, wherein the second capacitor set comprises a plurality of capacitors, and the capacitors of the second capacitor set are coupled in parallel between the first terminal and the second terminal of the second capacitor set.

8. The current sensing circuit as claimed in claim 7, wherein the current sensing unit selects a first capacitor in the first capacitor set and a second capacitor in the second capacitor set, one terminal of the first capacitor is coupled to the output terminal of the operation amplifier, the other terminal of the first capacitor is coupled to the first terminal of the operation amplifier, one terminal of the second capacitor is coupled to the first reference signal or the first voltage according to the second feedback signal and the third feedback signal, and the other terminal of the second capacitor is coupled to the first terminal of the operation amplifier or the second voltage according to the second feedback signal and the third feedback signal.

9. The current sensing circuit as claimed in claim 4, wherein the comparison unit comprises:
   a comparator comprising a first terminal, a second terminal and an output terminal, wherein the first terminal of the comparator is coupled to a second reference signal, the second terminal of the comparator is coupled to the output terminal of the operation amplifier to receive the sensing voltage, and the comparator compares the sensing voltage with the second reference signal so as to output the pulse signal at the output terminal of the comparator.

10. The current sensing circuit as claimed in claim 1, wherein the feedback control unit comprises:
    a first inverter coupled to the current sensing unit and inverting the pulse signal so as to produce a first feedback signal;
    an AND gate comprising a first terminal, a second terminal and an output terminal, wherein the first terminal of the AND gate is coupled to the current sensing unit to receive the pulse signal, the second terminal of the AND gate receives the clock signal and the AND gate outputs a second feedback signal at the output terminal of the AND gate according to the pulse signal and the clock signal; and
    a second inverter coupled to the AND gate and inverting the second feedback signal so as to produce a third feedback signal.

11. The current sensing circuit as claimed in claim 1, wherein the digital output unit comprises:
    an N-bit counter coupled to the current sensing unit and counting a pulse quantity of the pulse signal in a predetermined time duration so as to output the digital signal, wherein the pulse quantity is positively correlated to the current value.

12. The current sensing circuit as claimed in claim 1, further comprising:
    a controller coupled to the digital output unit and selecting the at least one capacitor in the first capacitor set and the at least one capacitor in the second capacitor set according to the digital signal so as to adjust the precision of the current sensing circuit.

13. The current sensing circuit as claimed in claim 1, wherein the controller adjusts a second voltage value according to the digital signal so as to adjust the precision of the current sensing circuit.

14. The current sensing circuit as claimed in claim 1, further comprising:
    a photodiode coupled to the current sensing unit and sensing a light source so as to produce the current.

* * * * *